United States Patent
Chu et al.

(10) Patent No.: US 6,557,354 B1
(45) Date of Patent: May 6, 2003

(54) THERMOELECTRIC-ENHANCED HEAT EXCHANGER

(75) Inventors: Richard C. Chu, Hopewell Junction, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/116,099

(22) Filed: Apr. 4, 2002

(51) Int. Cl.[7] .................................................. F25B 21/02

(52) U.S. Cl. ............................ 62/3.2; 62/259.2; 62/332; 62/333; 62/3.6; 62/3.7

(58) Field of Search ................ 62/259.2, 332, 62/333, 3.2, 3.6, 3.7

(56) References Cited

U.S. PATENT DOCUMENTS

| | | | | |
|---|---|---|---|---|
| 5,269,146 A | * | 12/1993 | Kerner ........................ | 62/3.6 |
| 5,584,183 A | | 12/1996 | Wright et al. ................ | 62/3.7 |
| 5,731,954 A | | 3/1998 | Cheon ........................ | 361/699 |
| 5,737,923 A | | 4/1998 | Gilley et al. ................ | 62/3.7 |
| 5,890,371 A | * | 4/1999 | Rajasubramanian et al. ........................ | 62/259.2 |
| 5,918,469 A | | 7/1999 | Cardella ...................... | 62/3.7 |
| 6,006,524 A | * | 12/1999 | Park ............................ | 62/3.7 |
| 6,058,712 A | * | 5/2000 | Rajasubramanian et al. .. | 62/3.6 |
| 6,164,076 A | | 12/2000 | Chu et al. .................... | 62/3.7 |
| 6,166,907 A | | 12/2000 | Chien ......................... | 361/699 |
| 6,196,003 B1 | | 3/2001 | Macias et al. ................ | 62/3.7 |
| 6,234,240 B1 | | 5/2001 | Cheon ........................ | 165/80.3 |
| 6,298,669 B1 | | 10/2001 | Maruyama et al. ........... | 62/3.2 |
| 6,338,251 B1 | * | 1/2002 | Ghoshal ...................... | 62/3.2 |
| 6,418,728 B1 | * | 7/2002 | Monroe ....................... | 62/3.2 |

FOREIGN PATENT DOCUMENTS

| | | | | |
|---|---|---|---|---|
| EP | WO 98/08038 | 2/1998 | ............ | H05K/7/20 |
| JP | 4155162 A | 5/1992 | ............ | H01L/35/30 |
| JP | 11340522 | 12/1999 | ............ | H01L/35/32 |

OTHER PUBLICATIONS

Ohkubo et al., pending U.S. patent application, Ser. No. 09/740,844, filed Dec. 21, 2000, entitled "Heat Exchanger", Publication No. US 2001/0013224 A1, publication date Aug. 16, 2001.

Chu et al., pending U.S. patent application entitled "Thermoelectric–Enhanced Heat Spreader For Heat Generating Component Of An Electronic Device", Ser. No. 09/606,984, filed Jun. 29, 2000.

Chu et al., pending U.S. patent application entitled "Thermal Spreader and Interface Assembly for Heat Generating Component Of An Electronic Device", Ser. No. 09/606,619, filed Jun. 29, 2000.

(List continued on next page.)

*Primary Examiner*—William C. Doerrler
*Assistant Examiner*—Mark S. Shulman
(74) *Attorney, Agent, or Firm*—Andrew J. Wojnicki, Jr., Esq.; Kevin P. Radigan, Esq.; Heslin Rothenberg Farley & Mesiti P.C.

(57) ABSTRACT

A heat exchanger using thermoelectric structures is provided for cooling a heat generating component of an electronic device. The heat exchanger includes a row of spaced passages, for example, formed by two or more separate tubes or a single coiled tube, for carrying a first cooling fluid. The heat exchanger further includes a thermoelectric structure disposed between adjacent spaced passages and exposed to a second cooling fluid. In one embodiment, the heat exchange also includes fins disposed between the same adjacent spaced passages so that the thermoelectric structure is disposed between the adjacent passages and the fins.

16 Claims, 3 Drawing Sheets

OTHER PUBLICATIONS

Chu et al., pending U.S. patent application entitled "Electronic Module With Integrated Programmable Thermoelectric Cooling Assembly and Method of Fabrication", Ser. No. 09/726,909, filed Nov. 30, 2000.

Chu et al., pending U.S. patent application entitled "Electronic Module With Integrated Thermoelectric Cooling Assembly", Ser. No. 09/726,900, filed Nov. 30, 2000.

"Two Stage Cooling System Employing Thermoelectric Modules", by Chu et al., Ser. No. 10/115,903 co-filed herewith.

Chu et al., pending U.S. patent application entitled "Cooling System With Auxillary Thermal Buffer Unit For Cooling An Electronic Module", Ser. No. 09/867,855, filed May 30, 2000.

* cited by examiner

THERMOELECTRIC-ENHANCED HEAT EXCHANGER

CROSS-REFERENCE TO RELATED APPLICATIONS

This application contains subject matter which is related to the subject matter of the following applications and patents which are assigned to the same Assignee as this application. The below-listed applications and patents are hereby incorporated herein by reference in their entirely:

"TWO STAGE COOLING SYSTEM EMPLOYING THERMOELECTRIC MODULES", by Chu et al., Ser. No. 10/115,903 filed Apr. 4, 2002 co-filed herewith;

"COOLING SYSTEM WITH AUXILIARY THERMAL BUFFER UNIT FOR COOLING AN ELECTRONIC MODULE," by Chu et al., Ser. No. 09/867,855, filed May 30, 2001;

"THERMOELECTRIC-ENHANCED HEAT SPREADER FOR HEAT GENERATING COMPONENT FOR AN ELECTRONIC DEVICE," by Chu et al, Ser. No. 09/606,984, filed Jun. 29, 2000;

"THERMAL SPREADER AND INTERFACE ASSEMBLY FOR HEAT GENERATING COMPONENT OF AN ELECTRONIC DEVICE," by Chu et al., Ser. No. 09/606,619, filed Jun. 29, 2000;

"ELECTRONIC MODULE WITH INTEGRATED THERMOELECTRIC COOLING ASSEMBLY," by Chu et al., Ser. No. 09/726,900, filed Nov. 30, 2000;

"ELECTRONIC MODULE WITH INTEGRATED PROGRAMMABLE THERMOELECTRIC COOLING ASSEMBLY AND METHOD OF FABRICATION," by Chu et al., Ser. No. 09/726,909, filed Nov. 30, 2000; and "THERMOELECTRIC COOLING ASSEMBLY WITH THERMAL SPACE TRANSFORMER INTERPOSED BETWEEN CASCADED THERMOELECTRIC STAGES FOR IMPROVED THERMAL PERFORMANCE," by Chu et al., U.S. Pat. No. 6,164,076, issued Dec. 26, 2000.

TECHNICAL FIELD

The present invention is generally directed to cooling systems, and more particularly, to a cooling system employing a heat exchanger with thermoelectric structures disposed between adjacent tubes thereof for enhanced cooling of heat generating components in, for example, an electronic device such as a mainframe computer or other electronic system requiring cooling.

Background of the Invention

As is well known, as the circuit density of electronic chip devices increases in order to achieve faster and faster processing speed, there is a correspondingly increasing demand for the removal of heat generated by these devices. The increased heat demand arises both because the circuit devices are packed more closely together and because the circuits themselves are operated at increasingly higher clock frequencies. Nonetheless, it is also known that runaway thermal conditions and excessive heat generated by chips is a leading cause of failure of chip devices. Furthermore, it is anticipated that the demand for heat removal from these devices will increase indefinitely. Accordingly, it is seen that there is a large and significant need to provide useful cooling mechanisms for electronic circuit devices.

The use of large thermoelectric cooling elements is known. These elements operate electronically to produce a cooling effect. By passing a direct current through the legs of a thermoelectric device, a temperature difference is produced across the device which may be contrary to that which would be expected from Fourier's Law.

At one junction of the thermoelectric element both holes and electrons move away, toward the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (air or water). When direct current is passed through these thermoelectric modules a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the module.

Although the use of cooling systems with heat exchangers is known, there continues to be a need for further enhanced cooling of circuit devices considering the ever increasing processing speeds and space constraints.

SUMMARY OF THE INVENTION

The shortcomings of the prior approaches are overcome, and additional advantages are provided, by the present invention which in one aspect comprises a heat exchanger using thermoelectric structures to facilitate cooling of an electronic device. Moreover, it should be understood that a heat exchanger in accordance with the present invention is not limited to cooling electronic devices, but rather, has many applications such as, for example, cooling heat generating mechanical components. For simplicity, the following discussion of a heat exchanger in accordance with an aspect of the present invention is focused on cooling electronic devices, with the understanding that it may be employed in other applications as well.

In one embodiment, the heat exchanger comprises one or more pairs of adjacent spaced passages. The adjacent spaced passages are in fluid communication with an input port of the heat exchanger and are configured to carry a cooling fluid received through the inlet port. The heat exchanger further includes a cooling subsystem configured to remove heat from one or more pairs of the adjacent spaced passages. The cooling subsystem has at least one thermoelectric structure, which is disposed between at least one pair of the adjacent spaced passages.

In another aspect, a heat exchange made in accordance with an aspect of the present invention may be part of a cooling system. The cooling system may include a heat transfer device, which is configured to remove heat from a heat generating component. The input port of the heat exchanger is in fluid communication with the heat transfer device of the cooling system.

In a further aspect, a method of fabricating a heat exchanger for cooling a heat generating component is provided. This method includes: providing one or more pairs of adjacent spaced passages, the adjacent spaced passages being in fluid communication with an input port and being configured to carry a cooling fluid; and disposing a cooling subsystem between at least one pair of the one or more pairs of adjacent spaced passages, the cooling subsystem being configured to remove heat from one or more of the adjacent spaced passages, the cooling subsystem comprising at least one thermoelectric structure.

Various additional enhanced structures and methods are also described and claimed hereinbelow.

Advantageously, by using thermoelectric structures or modules integrated with a heat exchanger comprising part of a fluid-based cooling system, the overall heat removal capability at a given temperature for a given volume and volumetric air flow through the heat exchanger is enhanced.

Additional features and advantages are realized through the techniques of the present invention. Other embodiments and aspects of the invention are described in detail herein and are considered part of the claimed invention.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Generally stated, provided herein is a thermoelectric-enhanced heat exchanger for facilitating heat removal within a cooling system for an electronic device, such as an electronic module. The cooling system thermally couples to a heat generating component, such as, for example, one or more integrated circuit chips, disposed within the electronic device. The thermoelectric-enhanced heat exchanger includes thermoelectric structures or modules thermally coupled between adjacent fluid carrying passages or tubes of the heat exchanger. For example, a first thermoelectric structure and a second thermoelectric structure may be disposed between each pair of adjacent coolant carrying passages of the heat exchanger. This structure may be further enhanced with the provision of air-cooled fins disposed between the first and second thermoelectric structures.

Figure 1:
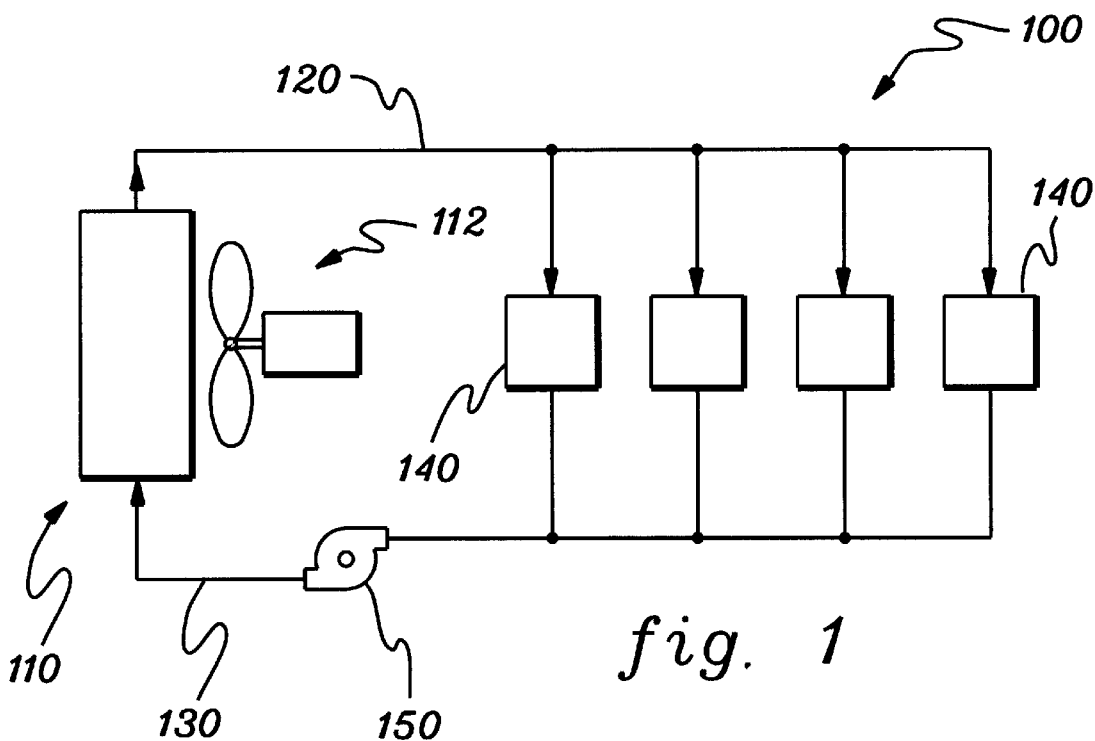
FIG. 1 depicts one embodiment of a cooling system employing a heat exchanger, in accordance with an aspect of the present invention.

FIG. 1 depicts one embodiment of a cooling system, generally denoted 100, having a heat exchanger 110 using at least two heat transfer fluids to assist in cooling heat generating components (not shown) of an electronic device, such as, for example, a computer. As used herein, "heat transfer fluid" means any gas or liquid that is capable of transferring heat. For example, the heat transfer fluid might comprise air, water, silicone fluid, Freon-based coolants, helium, liquid nitrogen and the like.

As shown in FIG. 1, cooling system 100, includes a heat exchanger 110 connected in series via circulation conduits 120, 130 with one or more heat transfer devices 140 (e.g. cold plates), and a pump 150 to assist in circulating a first heat transfer fluid through system 100. A fan 112 may be included to provide air flow across heat exchanger 110 as a second heat transfer fluid to assist in cooling the first heat transfer fluid passing through the heat exchanger.

Heat transfer devices 140 would include an inlet and an outlet with a passageway therebetween for carrying the cooling fluid (i.e., first heat transfer fluid), which circulates through system 100 and heat exchanger 110. Heat transfer devices 140 are thermally coupled to the heat generating components in, for example, the electronic device in order to cool these components. The circulation conduits of system 100 may include a first conduit 120, which may comprise one or more branches, extending from an outlet port of heat exchanger 110 to inlet ports of heat transfer devices 140 and a second conduit 130, which may comprise one or more branches, extending from outlet ports of heat transfer devices 140 to an inlet port of heat exchanger 110.

Figure 2:
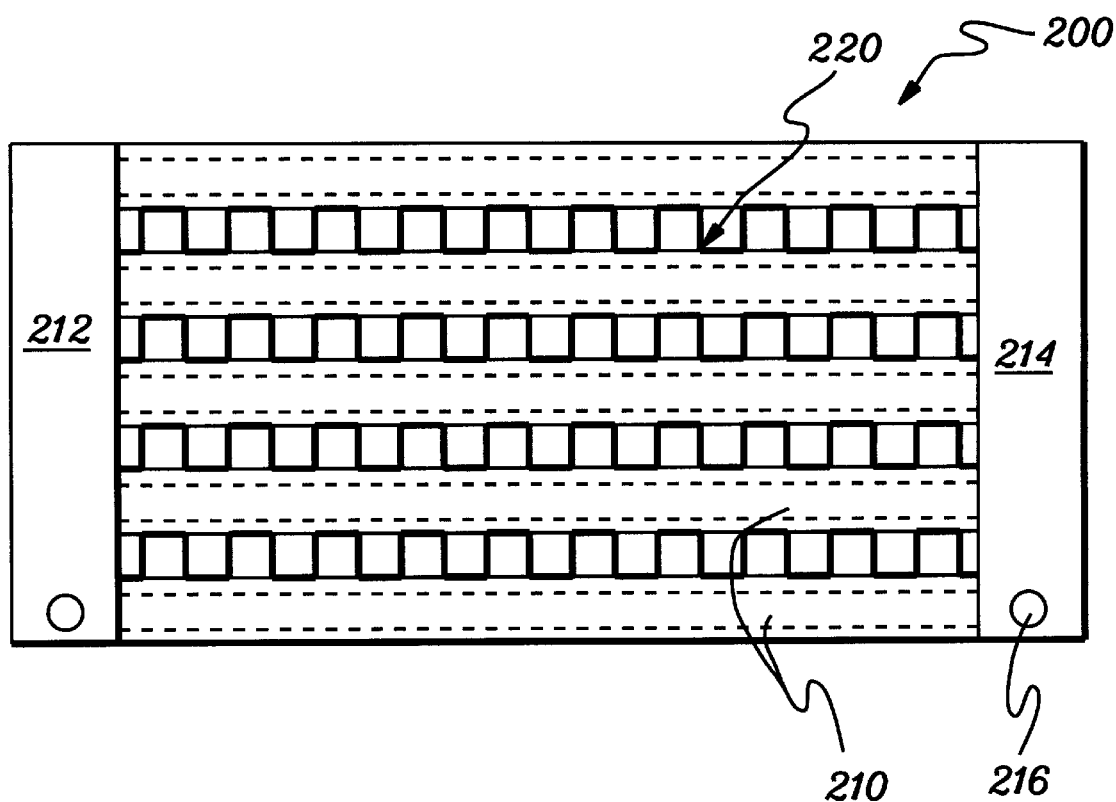
FIG. 2 depicts one embodiment of a heat exchanger, in accordance with an aspect of the present invention.

FIG. 2 depicts an embodiment of a heat exchanger in accordance with an aspect of the present invention. In this embodiment, heat exchanger 200 includes a plurality of spaced tubes 210. Each tube 210 comprises a passageway for carrying a cooling fluid (i.e., first heat transfer fluid). Typically, the fluid in tubes 210 is a liquid such as, for example water or some other liquid capable of transferring heat. However, air or other gases may also be used. The longitudinal axis of tubes 210 may be arranged, in one embodiment, perpendicular to the direction of flow of a second heat transfer fluid passing through heat exchanger 200. In the embodiment of FIG. 2, tubes 210 are in fluid-flow communication with an inlet chamber or manifold 212 and an outlet chamber or manifold 214 so that cooling fluid flows from inlet chamber 212 through tubes 210 into outlet chamber 214, from which it is discharged through an outlet port 216 for return to the heat transfer devices 140 (FIG. 1).

In an alternate embodiment, the spaced tubes 210 of FIG. 2 could be formed by a continuous or coiled circulation tube or channel having a plurality of substantially parallel, spaced tube sections, with the cooling fluid comprising a continuous flow therethrough.

Heat exchanger 200 also includes a plurality of fins 220 disposed between and thermally coupling adjacent pairs of tubes 210. As used herein, the term "fins" includes various surface configurations that provide increased surface area for heat dissipation, such as the illustrated folded fins configuration of FIG. 2.

In an alternate embodiment, fins 220 may be corrugated metal sheets or pieces projecting outwardly from the outer tube surfaces and extending between the gaps formed between adjacent tubes 210. Fins 220 may be secured to tubes 210 by, for example, a brazing material using known and suitable assembling device. In yet another embodiment, fins 220 may form tubes for carrying a heat transfer fluid such as air.

In the embodiment illustrated in FIG. 2, fins 220 and the outer surfaces of tubes or tube sections 210 cooperate to define passages for a second heat transfer fluid, which may be air flow caused by, for example, a fan 112 (see FIG. 1). The fin surfaces are thermally coupled to the first heat transfer fluid in order to extract and dissipate heat into the second heat transfer fluid (e.g., air).

For certain implementations, the approach of FIG. 2 may provide an insufficient cooling performance. As discussed in detail below, thermoelectric structures can be used to enhance the heat exchanger performance by improving overall heat removal at a given temperature for a given heat exchanger volume and volumetric air flow, as well as by increasing cooling to lower temperatures for a given heat load than otherwise achievable with the heat exchanger embodiment of FIG. 2.

Figure 3:
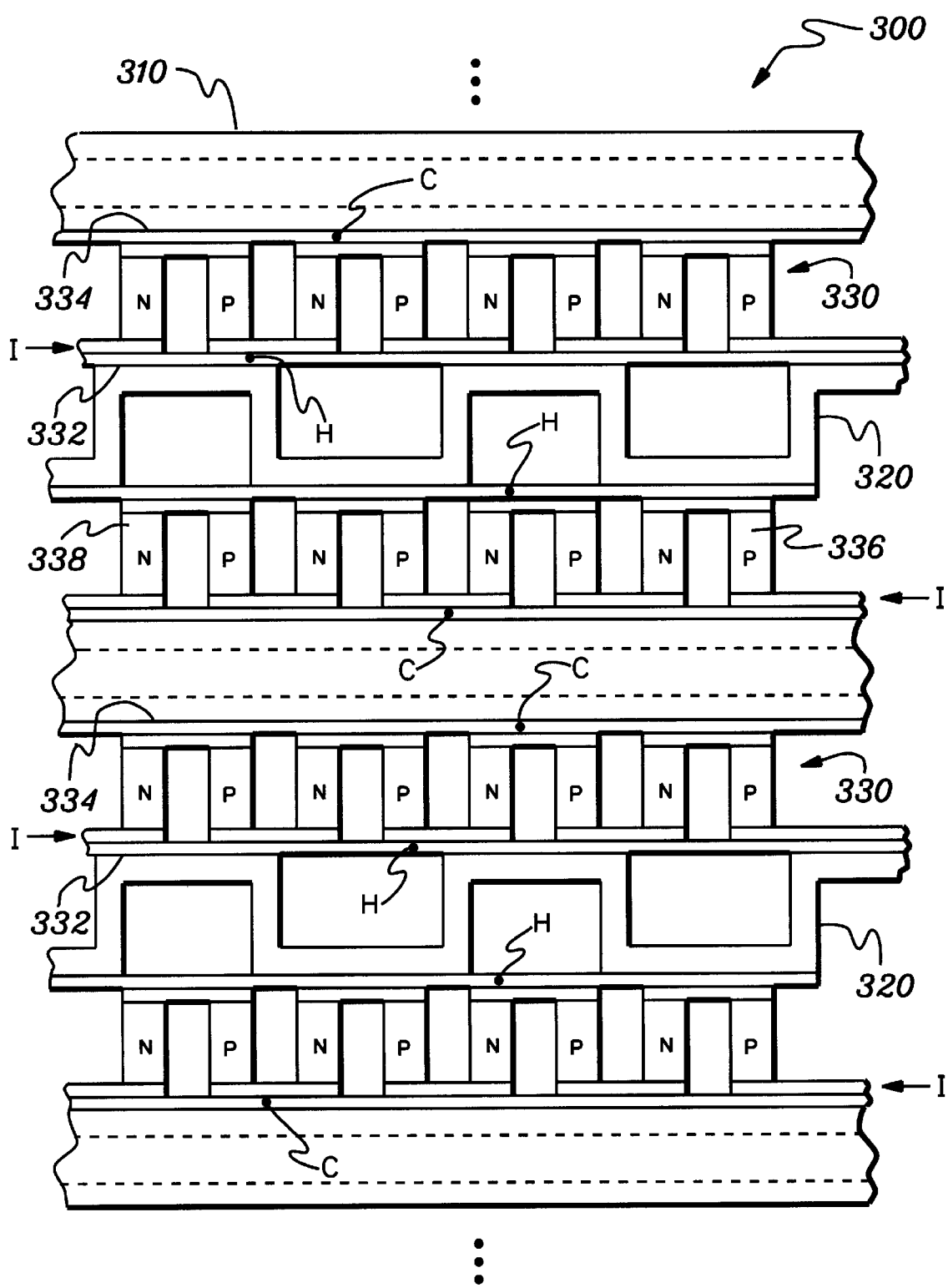
FIG. 3 depicts a partial view of another embodiment of a heat exchanger employing thermoelectric structures, in accordance with an aspect of the present invention.

FIG. 3 depicts another embodiment of a heat exchanger, generally denoted 300, in accordance with an aspect of the present invention. As shown, heat exchanger 300 includes thermoelectric structures 330 disposed between adjacent pairs of spaced tubes or spaced tube sections 310 of the heat exchanger. As used herein, the term "disposed between" means between and along the same plane as or in approximately the same row as the coolant carrying tubes or passages. Fins 320 may also be disposed between thermoelectric structures 330 as shown. If desired, other spaces between pairs of adjacent tubes or tube sections 310 may have the same structures as depicted in FIG. 3, or only fins 320, or thermoelectric structures 330.

Figure 4:
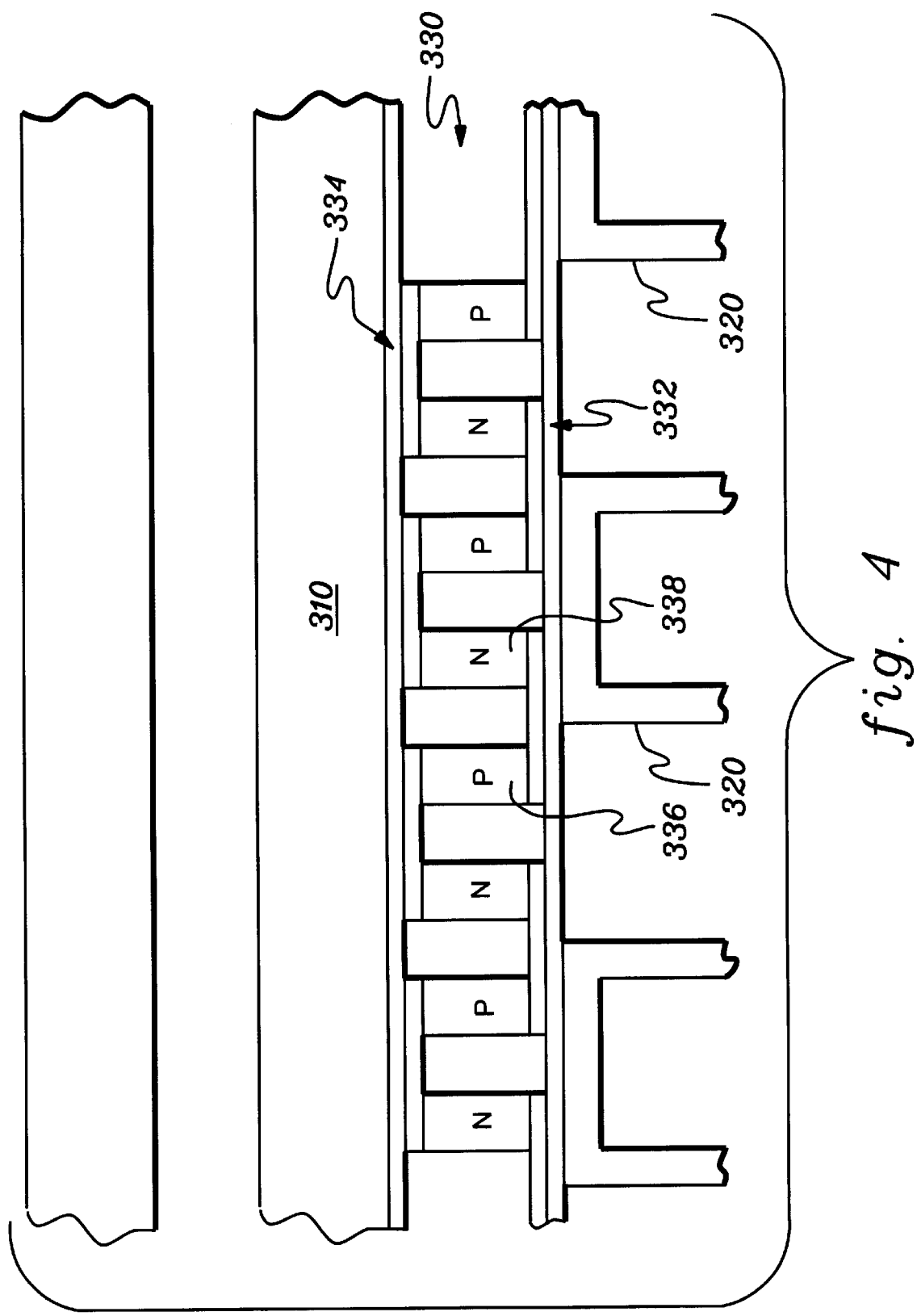
FIG. 4 depicts a partial view of the thermoelectric structures employed in the heat exchanger of FIG. 3, in accordance with an aspect of the present invention.

As noted above, the thermoelectric structures will transfer heat from one side to the other, essentially, by "electronically" pumping heat from a cold side "C" to a hot side "H". In the embodiment of FIGS. 3 and 4, hot side "H" 332 of each thermoelectric structure 330 is thermally coupled to fins 320, and thus, to the second cooling fluid (e.g. air), while cold side "C" 334 is thermally coupled to tubes 310. There are many ways to achieve this objective. For example, the direction of current flow I through the thermoelectric structures 330 could be varied as depicted in FIG. 3. Note that each thermoelectric structure 330 includes an array of p and n type couples 336, 338, respectively, which are sandwiched between the heat transfer substrates or surfaces of the thermoelectric structures 330.

At hot side 332 (which is thermally coupled to fins 320), energy is expelled from electrons within the thermoelectric structures, i.e., as the electrons jump from higher energy levels in the n-type material to lower energy levels in the p-type material. In this manner, heat absorbed at each cold side 334 (which is thermally coupled to tubes 310) is transported to the respective hot side 332 at a rate proportional to the amount of current passing through the circuit. Suitable thermoelectric structures for use with the heat exchanger of FIG. 3 are presently commercially available.

Referring to FIGS. 1 and 3, operationally as the heat generating component(s) generates heat, heat is transferred therefrom into the coolant fluid passing through heat transfer devices 140 (e.g. cold plates). Pump 150 pumps the heated coolant to an input port or entrance of the passages of the heat exchanger via circulation conduit 130. With coolant circulating or passing through tubes 310 of heat exchanger 300, heat is removed from the coolant and transferred via cold side 334 of thermoelectric structures 330 to hot side 332, and hence through fins 320 into the ambient air flowing through the heat exchanger. At the same time, fan 112 is operating to cause a current of air to flow across heat exchanger 110. After heat is removed from the liquid coolant, the coolant is returned via circulation conduit 120 to circulate though heat transfer devices 140.

Those skilled in the art will note from the above discussion that provided herein is an enhanced heat exchanger for use in cooling electronic components, or other type components. The heat exchanger may include thermoelectric structures to further enhance the ability to cool the electronic components by improving heat removal capability for a given heat exchanger volume and volumetric air flow. A thermoelectric-enhanced heat exchanger in accordance with the present invention can be readily designed for use with a specific heat generating component, e.g., an electronic module housing one or more integrated circuit chips, to ensure optimal temperature distribution on the component while minimizing cooling costs. In addition, by integrating thermoelectric structures and fins between adjacent pairs of passages carrying cooling fluid, space is conserved.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A heat exchanger having an input port, said heat exchanger comprising:
   one or more pairs of adjacent spaced passages, said adjacent spaced passages in fluid communication with said input port and being configured to carry a cooling fluid; and
   a cooling subsystem configured to remove heat from one or more of said adjacent spaced passages, said cooling subsystem comprising at least one thermoelectric structure disposed between each pair of multiple pairs of adjacent spaced passages.

2. The heat exchanger of claim 1, wherein said cooling subsystem includes a first thermoelectric structure and a second thermoelectric structure disposed between each pair of said multiple pairs of adjacent spaced passages.

3. The heat exchanger of claim 2, wherein said cooling subsystem further includes fins disposed between the first thermoelectric structure and the second thermoelectric structure of each pair of said multiple pairs of adjacent spaced passages, wherein said fins are configured to remove heat from said first thermoelectric structure or said second thermoelectric structure.

4. The heat exchanger of claim 2, wherein said cooling subsystem further includes fins disposed between the first thermoelectric structure and the second thermoelectric structure of each pair of said multiple pairs of adjacent spaced passages, wherein said fins are configured to remove heat from said first thermoelectric structure and said second thermoelectric structure.

5. The heat exchanger of claim 1, wherein said one or more pairs of adjacent spaced passages is formed by a continuous tube.

6. A cooling assembly, said cooling assembly comprising:
   a heat transfer device, said heat transfer device being configured to carry cooling fluid and to remove heat from a heat generating component; and
   a heat exchanger having an input port, said input port being in fluid communication with said heat transfer device, said heat exchanger comprising:
      one or more pairs of adjacent spaced passages, said adjacent spaced passages being in fluid communication with said input port and being configured to carry a cooling fluid; and
      a cooling subsystem configured to remove heat from one or more of said adjacent spaced passages, said cooling subsystem comprising at least one thermoelectric structure disposed between each pair of multiple pairs of adjacent spaced passages.

7. The cooling assembly of claim 6 wherein said cooling subsystem includes a first thermoelectric structure and a second thermoelectric structure disposed between each pair of said multiple pairs of adjacent spaced passages.

8. The cooling assembly of claim 7, wherein said cooling subsystem further includes fins disposed between the first thermoelectric structure and the second thermoelectric structure of each pair of said multiple pairs of adjacent spaced passages, wherein said fins are configured to remove heat from said first thermoelectric structure or said second thermoelectric structure.

9. The cooling assembly of claim 7, wherein said cooling subsystem further includes fins disposed between the first thermoelectric structure and the second thermoelectric structure of each pair of said multiple pairs of adjacent spaced passages, wherein said fins are configured to remove heat from said first thermoelectric structure and said second thermoelectric structure.

10. The cooling assembly of claim 6, further comprising a pump for circulating cooling fluid through said one or more pairs of adjacent spaced passages and said heat transfer device.

11. The cooling assembly of claim 6, wherein said heat generating component comprises part of an electronic device.

12. A method of fabricating a heat exchanger for cooling a heat generating component, said method comprising:
   providing one or more pairs of adjacent spaced passages, said adjacent spaced passages being in fluid communication with an input port of the heat exchanger and being configured to carry a cooling fluid received through the inlet port;
   disposing a cooling subsystem between at least one pair of said one or more pairs of adjacent spaced passages, said cooling subsystem being configured to remove heat from one or more of said adjacent spaced passages, said cooling subsystem comprising at least one thermoelectric structure; and
   further comprising disposing at least one thermoelectric structure between each pair of multiple pairs of adjacent spaced passages.

13. The method of claim 12, wherein said cooling subsystem includes a first thermoelectric structure and a second thermoelectric structure, said method further comprising disposing the first thermoelectric structure and the second thermoelectric structure between each pair of said multiple pairs of adjacent spaced passages.

14. The method of claim 13, wherein said cooling subsystem further includes fins, said method further comprising disposing fins between the first thermoelectric structure and the second thermoelectric structure of each pair of said multiple pairs of adjacent spaced passages, wherein said fins are configured to remove heat from said first thermoelectric structure or said second thermoelectric structure.

15. The method of claim 13, wherein said cooling subsystem further includes fins, said method further comprising disposing fins between the first thermoelectric structure and the second thermoelectric structure of each pair of said multiple pairs of adjacent spaced passages, wherein said fins are configured to remove heat from said first thermoelectric structure and said second thermoelectric structure.

16. A method for fabricating a cooling assembly for cooling an electronic device, said method comprising:
   thermally coupling a heat transfer device to a heat generating component, said heat transfer device being configured to carry a cooling fluid;
   positioning a heat exchanger in fluid communication with said heat transfer device, said heat exchanger having an input port, said heat exchanger comprising:
      one or more pairs of adjacent spaced passages in fluid communication with said input port, said adjacent spaced passages being configured to carry a cooling fluid received through the inlet port; and
      a cooling subsystem configured to remove heat from one or more of said adjacent spaced passages, said cooling subsystem comprising at least one thermoelectric structure disposed between each pair of multiple pairs of adjacent spaced passages.

* * * * *